United States Patent
Dang et al.

(10) Patent No.: US 9,070,586 B1
(45) Date of Patent: Jun. 30, 2015

(54) METHOD OF FORMING SURFACE PROTRUSIONS ON AN ARTICLE AND THE ARTICLE WITH THE PROTRUSIONS ATTACHED

(71) Applicant: International Business Machines Corporation, Armonk, NY (US)

(72) Inventors: Bing Dang, Chappaqua, NY (US); John Knickerbocker, Monroe, NY (US); Yang Liu, Ossining, NY (US); Maurice Mason, Yorktown, NY (US); Lubomyr T Romankiw, Briancliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/187,237

(22) Filed: Feb. 22, 2014

(51) Int. Cl.
*H01L 21/00* (2006.01)
*H01L 23/00* (2006.01)

(52) U.S. Cl.
CPC .............. *H01L 24/11* (2013.01); *H01L 24/14* (2013.01); *H01L 2924/01029* (2013.01); *H01L 2924/01022* (2013.01); *H01L 2924/014* (2013.01); *H01L 2224/1111* (2013.01); *H01L 2924/01028* (2013.01)

(58) Field of Classification Search
CPC ............ H01L 21/0337; H01L 21/4864; H01L 21/4875; H01L 21/4825; H01L 2021/60022; B05D 5/00; G01B 5/28; C23F 1/00
USPC .......... 257/737–738, 788, 784; 438/106–108, 438/614, 617, 612, 613, 112–113, 127, 124
See application file for complete search history.

(56) References Cited

U.S. PATENT DOCUMENTS

| | | | |
|---|---|---|---|
| 4,088,544 | A | 5/1978 | Hutkin |
| 5,114,543 | A | 5/1992 | Kajiwara et al. |
| 6,346,335 | B1 | 2/2002 | Chen et al. |
| 6,924,043 | B2 | 8/2005 | Suzuki et al. |
| 7,045,442 | B2 | 5/2006 | Maruyama et al. |
| 7,105,448 | B2 | 9/2006 | Takayama et al. |
| 7,363,705 | B2 | 4/2008 | Kim et al. |
| 7,927,971 | B2 | 4/2011 | Tamura et al. |
| 2009/0243126 | A1* | 10/2009 | Washiya et al. ............... 264/2.5 |
| 2012/0279287 | A1 | 11/2012 | Andry et al. |

OTHER PUBLICATIONS

Reid, J., McKerrow, A., Varadarajan, S. and Kozlowski, G., "Copper electroplating approaches for 16nm technology," Solid State Technology 53(5), 14-16 (2010).

* cited by examiner

*Primary Examiner* — Hoa B Trinh
(74) *Attorney, Agent, or Firm* — Law Office of Charles W. Peterson, Jr.; Louis J. Percello, Esq.

(57) ABSTRACT

A method of forming surface protrusions on an article, and the article with the protrusions attached. The article may be an Integrated Circuit (IC) chip, a test probe for the IC chip or any suitable substrate or nanostructure. The surface protrusions are electroplated to a template or mold wafer, transferred to the article and easily separated from the template wafer. Thus, the attached protrusions may be, e.g., micro-bumps or micro pillars on an IC chip or substrate, test probes on a probe head, or one or more cantilevered membranes in a micro-machine or micro-sensor or other micro-electro-mechanical systems (MEMS) formed without undercutting the MEMS structure.

16 Claims, 12 Drawing Sheets

METHOD OF FORMING SURFACE PROTRUSIONS ON AN ARTICLE AND THE ARTICLE WITH THE PROTRUSIONS ATTACHED

BACKGROUND OF THE INVENTION

1. Field of the Invention

The present invention is related to semiconductor device manufacturing and more particularly to forming protrusions on an article, such as a semiconductor integrated circuit (IC) chip.

2. Background Description

Typical semiconductor integrated circuit (IC) chips have layers stacked such that layer features overlay one another to form individual devices and connect devices together. ICs are mass produced by forming an array of chips on a thin semiconductor wafer. Each array location is known as a die and each die may harbor a multilayered structure, such as an IC chip or a structure for test or alignment.

As transistor technologies have evolved, chip features and devices have gotten smaller and smaller and have minimum dimensions that typically are well below one micrometer (1 μm) or 1 micron. Smaller chip features and devices allow IC manufacturers to integrate more function in the same chip real estate. A typical IC can include billions of transistors wired together into circuits providing chip function. IC circuits may also include micro-machine structures such as micro-sensors or other micro-electro-mechanical systems (MEMS) structures. A typical MEMS structure, such as a cantilever and membrane formation, has been formed by stacking multiple layers of interlevel vias beneath a surface wiring structure and undercutting the surface wiring without damaging surrounding features.

The surface layer of each completed chip or die is typically populated by probable off-chip pads for connecting to chip power and input/output (I/O) signals. Packing more function on each die typically means providing more and more I/O signals for each die, on one (top), or for a three dimensional (3D) chip structure, both (top and bottom) sides. Each die has at least one surface pad for each I/O signal and a number of power (supply and ground) connection pads. Providing these I/O signals and supply as die are shrinking in size, therefore, drives more stringent off-chip I/O connection requirements, i.e., increasingly dense I/O pad arrays. On a typical state of the art IC wafer, for example, the surface layer of each die may be populated by several thousand connection pads. To achieve this requires ultra-fine pitch pads on very tight a pitch less than 50 microns (<50 μm).

Typically, each of these very densely packed chip pads may also be populated with a solder ball, most commonly lead (Pb) free solder, for connecting the chip to, or mounting it on, a single or multi chip module. The solder balls, e.g., controlled collapsible chip connections (C4s), are formed or bumped onto the pads, for example, for what is known as ball grid array (BGA) joining. Any difficulty in forming these solder ball on a 2D chip surface at coarse pitch, e.g., 200 μm, is exacerbated for ultra-fine pitch arrays on both sides of a 3D chip or on a module surface.

Testing these tightly packed pads with or without solder balls requires very fine, delicate, tightly-packed test probes. Historically, what are known as cobra probes were used to probe down to 150 μm. Probing tightly-packed pads at 50 μm and below requires very precise probe tip geometry control and scalability. Achieving necessary probe tip precision for probing ultra-fine pitch pads has proven very difficult, and therefore, expensive.

Thus, there is a need for simplifying chip bumping for densely populated IC chip pads, for fabricating low cost probes for probing those ultra-fine pitch pads and bumps, and for simply forming MEMS structures without complicating manufacturing and without making process control more stringent.

SUMMARY OF THE INVENTION

A feature of the invention is a simple bumping method for forming protrusions on densely populated chip pads one or both sides of integrated circuit (IC) chips;

Another feature of the invention is a simple bumping method for forming micro-pillars on densely populated chip pads one or both sides of integrated circuit (IC) chips;

Yet another feature of the invention is a simple bumping method for forming solder bumps on densely populated chip pads one or both sides of integrated circuit (IC) chips;

Yet another feature of the invention is a low cost test probe for probing IC chips with densely populated chip input/output (I/O) connects;

Yet another feature of the invention is a simply formed MEMS structure, formed without complicated chip fabrication steps, such as undercutting and without the appurtenant more stringent process control.

The present invention relates to a method of forming surface protrusions on an article, and the article with the protrusions attached. The article may be an Integrated Circuit (IC) chip, an active test chip/module, a test probe for the IC chip or any suitable substrate or nanostructure. The surface protrusions are electroplated to a template or mold wafer, transferred to the article and easily separated from the template wafer. Thus, the attached protrusions may be, e.g., micro-pillars or solder bumps on an IC substrate, test probes on a probe head, or one or more cantilevered membranes in a micro-machine or micro-sensor or other micro-electro-mechanical systems (MEMS) formed without undercutting the MEMS structure.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
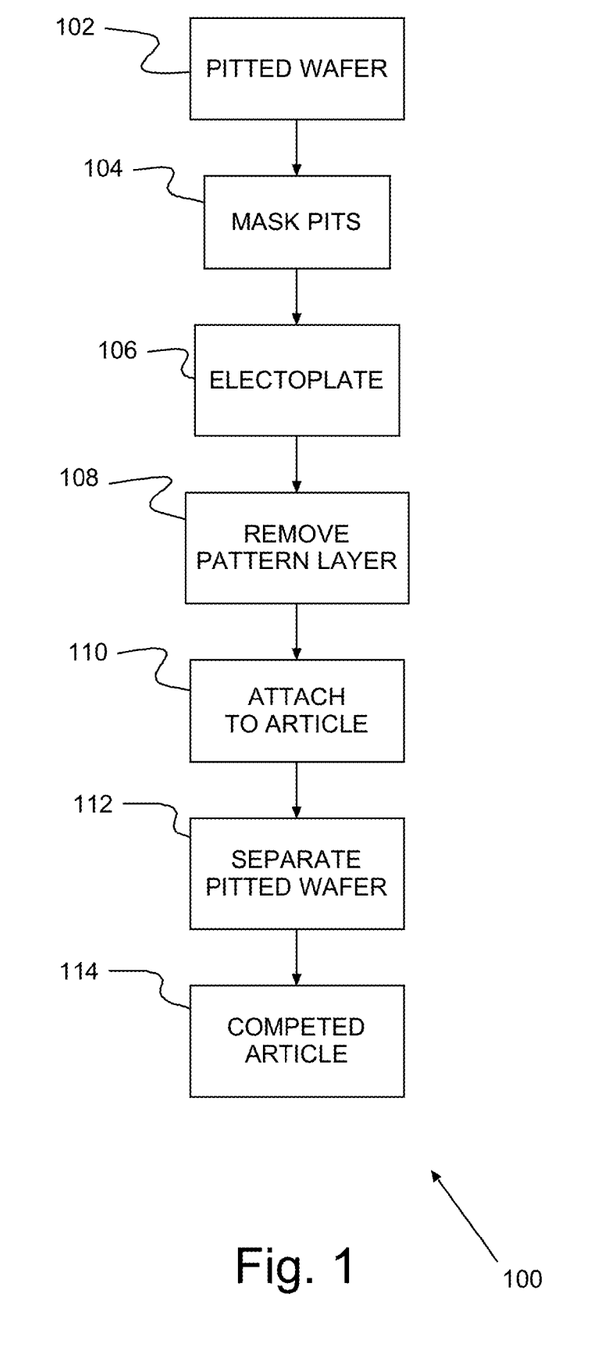
FIG. 1 shows an example of a method of forming protrusions and transferring the protrusions to an article according to a preferred embodiment of the present invention.

Turning now to the drawings and, more particularly, FIG. 1 shows an example of a method 100 of forming surface protrusions, e.g., test probes, solder bumps, micro pillars and/or cantilevered membranes, on an article according to a preferred embodiment of the present invention. The surface protrusions are electroplated to a low adhesion surface layer on a template or mold wafer 102, attached to the article and the template wafer 102 is removed. The low adhesion surface layer makes separating the template wafer 102 from the completed article easy.

Previously, using a low adhesion material, e.g., a native oxide on a titanium (Ti) layer or multi-layer, as a base for electroplating had made it difficult to initiate uniform nucleation and provided unstable results. Nucleates frequently fell in to the electroplating solution, causing difficult and non-uniform nucleation. Subsequently in post-plating cleaning steps, the larger deposition film/structure may detach prematurely (e.g., during a rinse or blow dry) because of low adhesion and/or non-uniform nucleation. With structures the article is defective and the detached structures contaminate the plating solution. These problems made electroplating on low adhesion seed material unsuitable for forming tightly spaced metal features because plated features were often not uniform, inadvertently detached, and/or were shorted together by contamination particles. Electroplating a stressed thick layer to a surface film exacerbates these problems. The inventors have overcome these electroplating problems by providing a non-planar low adhesion plating surface.

A sacrificial pattern is formed 104 on the template wafer 102 that covers the low adhesion seed layer around the pits such that only selected surface areas remain exposed. Electroplating 106 occurs on the exposed low adhesion seed layer at least partially filling each pit, forming inverted metal protrusion or bump in the respective pit. Removing 108 the sacrificial pattern layer exposes the metal protrusions for transfer. Next, the exposed metal protrusions, still attached to the template wafer, are attached 110 to the article. Once attached, the template wafer is separated 112, e.g., pulled or pried off, from the article with the metal protrusions remaining attached to the completed article 114.

Optionally, after transferring all protrusions, the template wafer 102 may be refreshed first by brushing off any residual, process monitoring or measuring protrusions, e.g., in the Kerf region. A quick etchant-rinse, e.g., a diluted hydrofluoric acid dip and deionized water rinse, strips oxide from the surface of the low adhesion seed layer. Fresh native oxide regrows in air. After refreshing, the template wafer 102 may be reused to repopulate protrusions. Because native oxide is a mono layer the template wafer 102 may be refreshed and reused a number of times, depending on the metal (Ti) thickness, etchant chosen, and process control.

Although described herein with regard to specific implementations for forming specific completed articles 114, it is understood that the present invention has application to electroplating a shape or membrane of any suitable size and shape on a low adhesion layer formed on a roughened wafer for transference to an article 114, e.g., a wafer with cavities or pits intentionally formed at one or more specific locations. The surface roughness temporarily tacks the shape or membrane to the low adhesion surface until electroplating, stripping and cleaning is complete, and allows the shape or membrane to detach with relatively low force once attached to the article 114. Thus, the completed article 114 may be, for example, an Integrated Circuit (IC) chip with array of high density input/output (I/O) pads bumped with solder from protrusions, e.g., micro-pillars or micro-C4s, according to the present invention. In another example, the article may be a probe head with a tight array of protrusions forming probe tips for testing high density IC chip I/O pads.

In yet another example, the article may include one or more micro-machine or micro-sensor or other micro-electro-mechanical systems (MEMS) protrusion simply formed, and without requiring undercutting the MEMS structure. Each protrusion integrally forms a cantilever and membrane for transfer to the article. This avoids using complicated process controls previously required to stack vias and undercut the complicated structure in place on the article during manufacturing. Moreover, the MEMS structure may be attached to any substrate and/or any nano-structure without requiring any consideration of compatibility of such an undercut, or the materials used in undercutting (e.g., wet or dry etch), with the substrate and/or any nano-structure.

Figure 2A:
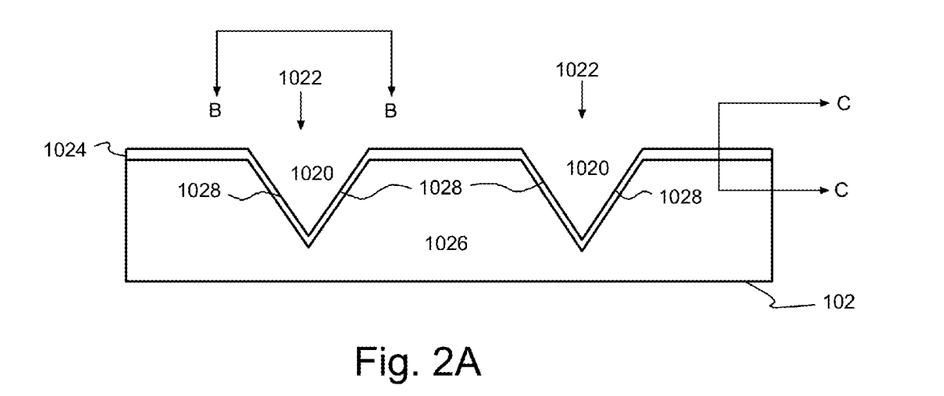
FIGS. 2A-C show an example of a preferred template wafer, pitted at protrusion locations.
Figure 2B:
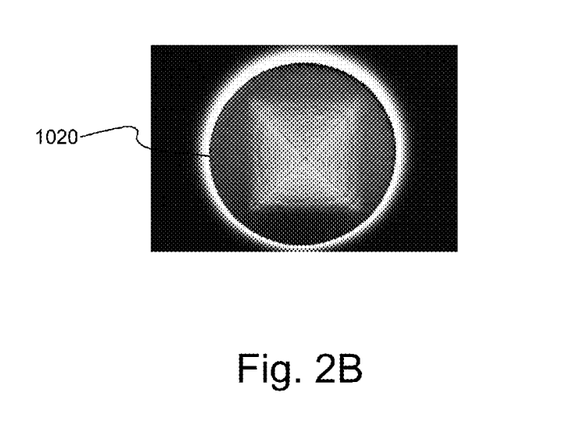
Figure 2C:
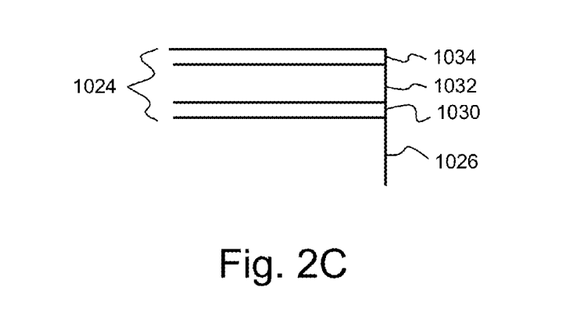

FIGS. 2A-C show a cross-sectional example of a preferred template wafer 102, a top down view at pit 1020 at protrusion locations 1022 (B-B) of in FIG. 2B, and an expanded cross-sectional view (through C-C) example of FIG. 2C. As noted hereinabove, the preferred template wafer 102 is pitted 1020 at least at protrusion locations 1022, and covered with a low adhesion surface or seed layer 1024 that coats each pit 1020.

The coated pits 1020 provide a non-planar surface that causes local current crowding in each pit 1020 that helps nucleation in the pit 1020 without risking current stability because the anchoring effect allows continuous current supply. Further, the pit cavities 1020 provide a fluid boundary layer, that provides for mass transfer by diffusion rather than bulk flow, and that prevents bath agitation from unintentionally detaching nucleates. Moreover, when electroplating a continuous film on the template wafer 102, the low adhesion seed layer 1024 in cooperation with the underlying structure (pits 1020) anchor the film to prevent delamination, while supplying stable, uniform current for continuous deposition. Because the nucleate adheres to the seed layer 1024, and the seed layer adheres to the pits 1020 and horizontal surfaces there between, the electroplating solution remains relatively free of particulate contamination. The pits 1020 allow subsequently plated horizontal film expansion to release stress. Finally, the stressed material forming the template wafer 102 facilitates thicker breakage-free plating, releasing stress both in metal plated the cavities, and by film delamination on flat portions between pits 1024. Further, the template wafer 102 may be refreshed and reused for fabricating and attaching protrusions to additional articles.

Preferably the template wafer 102 is a silicon 1026 with prismic, conical, cylindrical or pyramidal pits 1020. In this example, the pits 1020 have an inverted pyramid shape with a square base and equilateral triangle shaped sides 1028. For bumping an IC chip with an array of micro-pillars, or a ball grid array (BGA) of micro-C4s at 50 micrometers or microns (50 $\mu m$) and below, or for forming a test probe for such a wafer, the pits 1020 are 1-25 $\mu m$ deep, preferably 8 $\mu m$ deep, with a surface diagonal/diameter 1-50 $\mu m$, preferably 14 $\mu m$. The pits may be formed using any well-known semiconductor pattern and etch process, e.g., such as is used for trench formation in deep or shallow trench isolation (STI). Although any suitable wet or dry etch may be used, preferably, an anisotropic wet etch using Tetramethylammonium hydroxide (TMAH or TMAOH), etches the pyramidal pits 1020 in the surface of silicon wafer 1026. Further, as the pits 1020 may be formed using a well-known pattern and etch, the pits 1020 are scalable down to any size and any pitch, depending upon the particular technology features selected.

The low adhesion seed layer 1024 coats each pit 1020, and preferably, is multi-layer 1030, 1032, 1034 metal layer. In this particular example, a base layer 1030, e.g., titanium, formed directly on the silicon template wafer 1026 insures good adhesion to the silicon substrate 1026. A highly conductive layer 1032, e.g., copper (Cu), silver (Ag) or gold (Au), formed on base layer 1030 insures uniform current distribution, to maintain current stability during electroplating. A surface layer 1034 of seed material, e.g., Ti, is formed on highly conductive layer 1032. Native oxide (not shown) formed on Ti surface layer 1034 insures sufficiently low adhesion to the Ti surface layer 1034 to allow subsequently separating the electroplated material with relatively low force.

The surface non-linearity or other surface roughness, pits in this example, facilitates plating nucleation, maintains adherence of subsequently plated metal to the template wafer during plating, with sufficiently low adhesion release the plated with relatively low force. Other suitable seed materials may include, for example, stainless steel and chromium (Cr). Also, the low adhesion seed layer 1024 may be a single metal layer, if that layer sufficiently adheres to the silicon substrate 1026 and provides sufficiently uniform current distribution.

FIGS. 3A-D show an example of forming 100 a probe head with a tight array of probe pads or tips for testing high density IC chip I/O pads, formed as described in FIG. 1. Preferably, each probe tip includes a capping material layer 120 forming a hard tip cap, electroplated 106 to the low adhesion seed layer 1024 after forming and patterning 104 a sacrificial layer 122 on the template wafer 102 in FIG. 3A. The patterned sacrificial layer 122 defines protrusion locations 1022 above each pit 1020 coated with low adhesion seed layer 1024. Alternately, in a multi-pointed tip embodiment, each probe tip is formed over multiple pits 1020 with the surface between the pits 1020 uninterrupted by patterned sacrificial layer 122 and subsequent plating uniformly occurring at the pits 1020 and there-between. In this single-pointed tip example, the hard caps 120 cover the low adhesion seed layer 1024 only at the bump locations 1022, and completely line the pits 1020. Preferably, the capping material is nickel (Ni), cobalt (Co), iron (Fe), suitable refractory metal or an alloy thereof, electroplated to a thickness of 1-30 μm, preferably 5 μm.

Figure 3A:
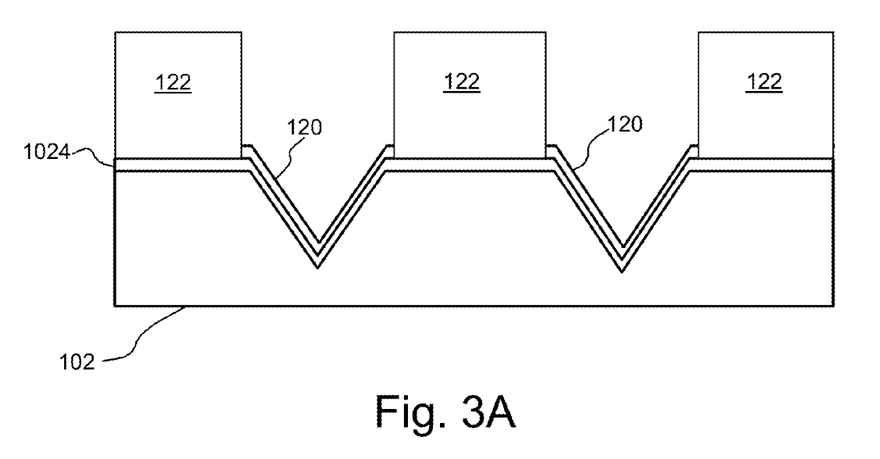
FIGS. 3A-D show an example of forming a probe head with a tight array of probe pads or tips for testing high density IC chip I/O pads.
Figure 3B:
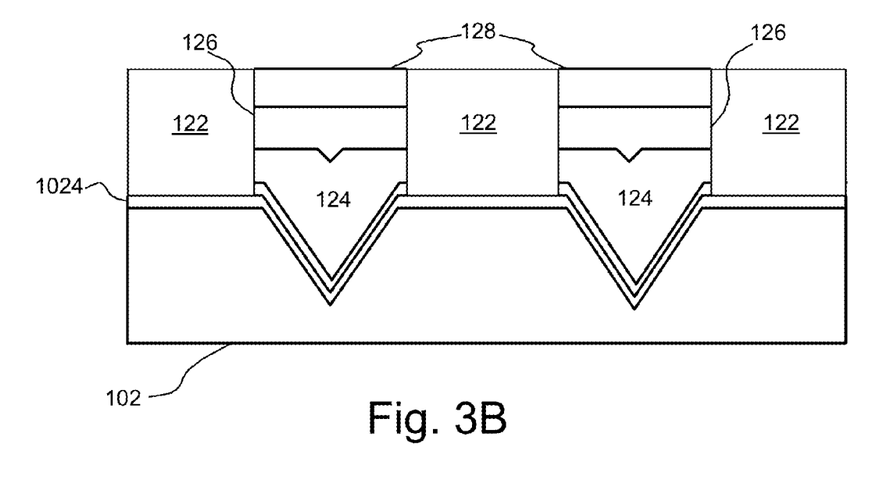

In FIG. 3B, a conductive plug 124, e.g., copper, is plated 106 to the hard caps 120, such that the plated copper plug 124 has a minimum thickness of 1-100 μm, preferably 10 μm. Next, a base layer 126, preferably nickel, is electroplated to the conductive plug 124, and attach material 128, preferably, lead-free solder, such as a tin/silver (Sn/Ag) solder, is electroplated to the base layer 126. In this example, the base layer 126 is 0.5-3 μm, preferably 2 μm, thick; and the attach material 128 is 1-100 μm, preferably 10 μm, thick. Also in this example, the inverted metal protrusions, or probe tips 130, completely fill each pit 1020.

Figure 3C:
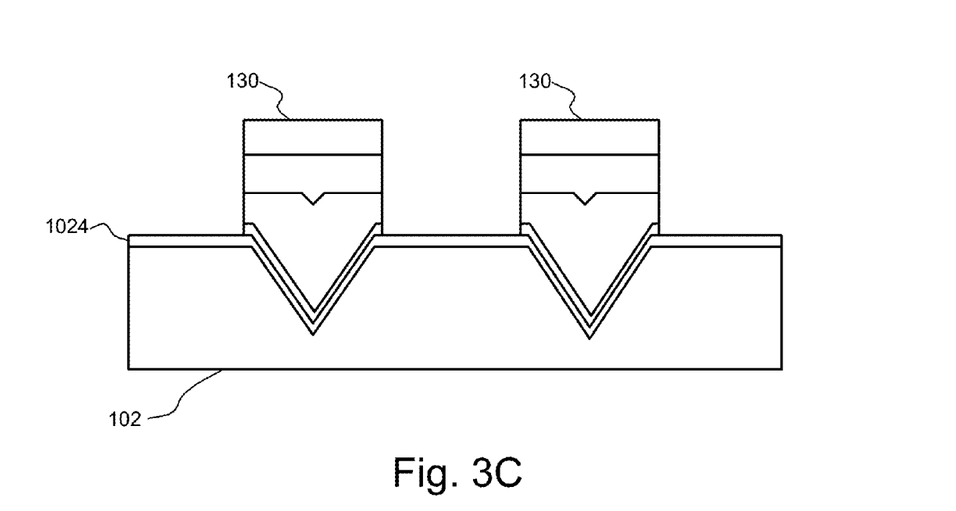

Removing 108 the patterned sacrificial layer 122 in typical wet strip, rinse, and dry, exposes the inverted probe tips 130 in FIG. 3C. Even though adhesion is low, there is still sufficient adhesion to hold the features (inverted probe tips 130) in place when the resist is stripped.

Figure 3D:
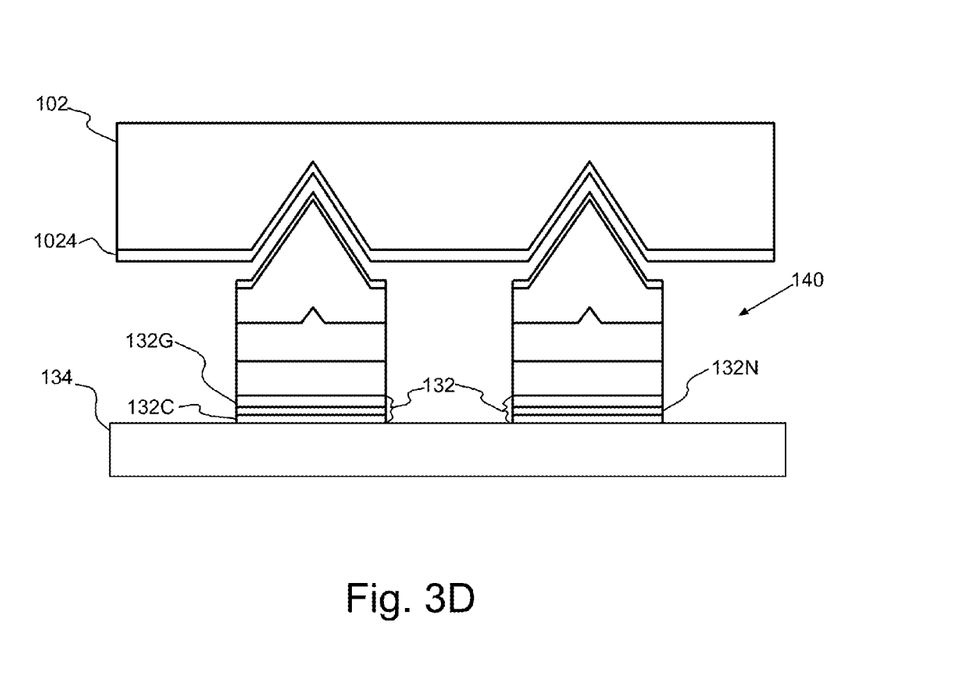
Figure 4:
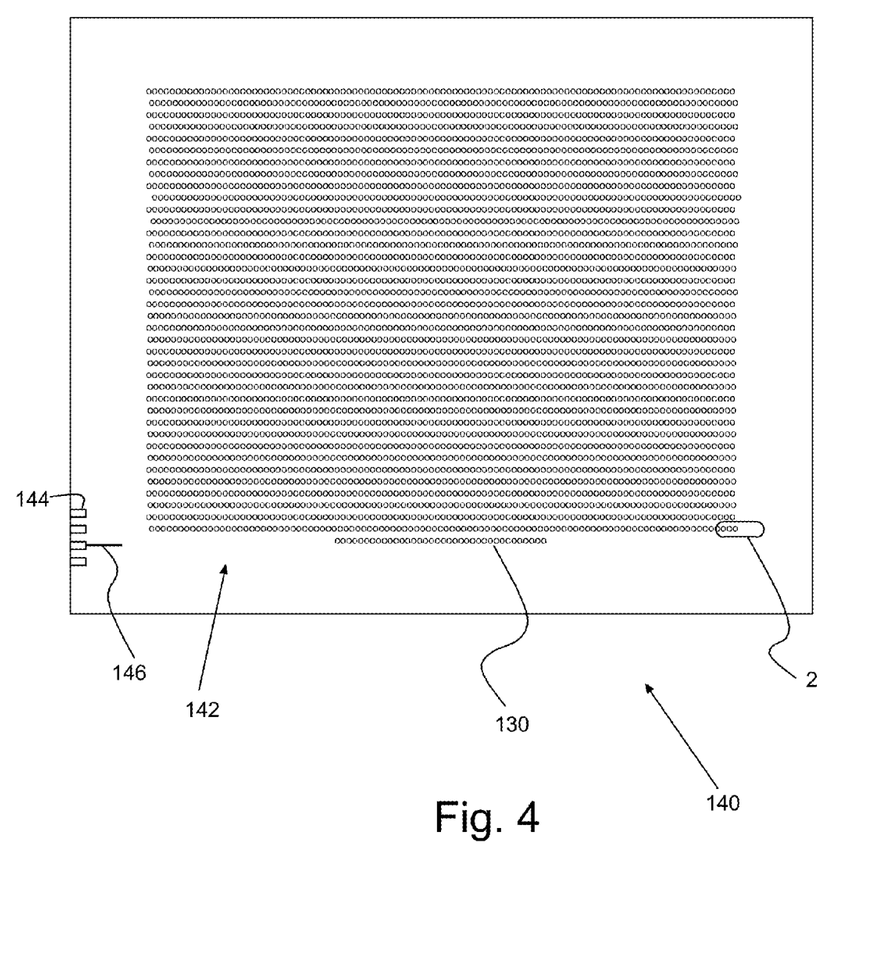
FIG. 4 shows an example of an article with an array of attached protrusions.

Next, the exposed metal protrusions 130, still attached to the template wafer 102, are attached 110 to the article 114, e.g., soldered to pads 132 on probe head substrate 134, e.g., a ceramic, silicon or organic substrate, in FIG. 3D. In this example, pads 132 are layered pads that include a base layer 132C, preferably copper, on probe head 134, an interface layer 132N, preferably nickel, on base layer 132C, and a anti-oxidation layer 132G, preferably gold, on the interface layer 132N. Although described with reference to soldering, any suitable attachment method, e.g., gluing, may be used for attaching the probe tips 130 to the pads 132. Once the probe tips 130 are attached to the pads 132, the template wafer 102 is separated 112 from the completed probe head 140, using very little force to pry or pull the template wafer 102 off FIG. 4 shows an example of an article 140, e.g., a semiconductor substrate, with an array of attached protrusions. The protrusions may be, for example, probe tips 130 formed substantially as described in FIGS. 1 and 3A-D with like features labeled identically. In this example, the article 140 includes a protrusion array 142 of mounted probe tips 130 that may be on a pitch at or less than fifty microns (50 μm). Lands 144 for external protrusions connections are located on either side of the article 140, connecting external signals and power (not shown) to individual tips 130 through surface and subsurface wiring 146. Lands 144 may include typical IC pads for peripheral wire bonding or for forming a C4 peripheral array. Wires 146 are typically on a much closer pitch than the pads 130, typically more than an order of magnitude less. Also, although only four (4) lands 144 are shown in this example, typically, there may be at least one land 144 for each probe tip 130. In addition support circuits, e.g., IC switches and gates (not shown), may be formed on the wafer for each die as desired.

It should be further noted that although an array of probe tips 130 are shown attached to the article 140 in this example, this is for example only. The article 140 may be an IC chip with a BGA bumped with micro-C4s or an array of micro pillars, both formed as described hereinbelow. The corresponding article (IC chip) will look substantially similar to the example of FIG. 4 except, perhaps, without periphery lands 144.

FIGS. 5A-D show an example of forming 100 a BGA of micro C4s in a tight array of high density IC chip I/O connects, also known as "bumping" the IC(s), formed as described in FIG. 1, and substantially similar to forming the probe tips and head of FIGS. 3A-D, with like features labeled identically. By design a probe array (142 in FIG. 4) of probe tips 130 for probing and testing an IC matches the ball grid array being probed. Thus, the same or substantially similar, template wafer 102 may be used for forming both the probe array 142 and the BGA for chip I/O connects. After forming and patterning 104 the sacrificial layer 122 on the template wafer 102, a connective plug 150 of a suitable solder, e.g., Sn/Ag, is plated with a minimum thickness of 1-50 μm, preferably 20 μm. In this example, the connective plugs 150 are inverted connective bumps that partially fill each pit 1020.

Figure 5A:
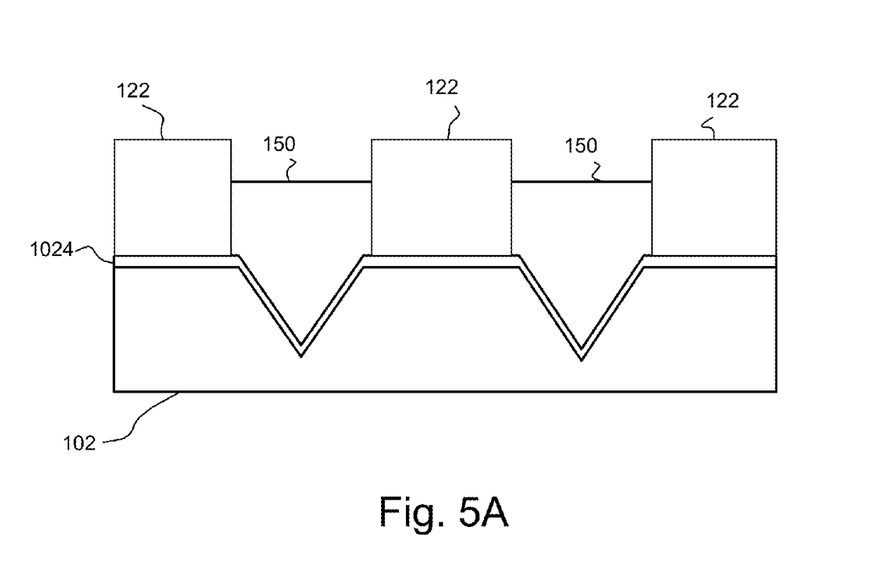
FIGS. 5A-D show an example of forming a BGA of micro C4s in a tight array of high density IC chip I/O connects.
Figure 5B:
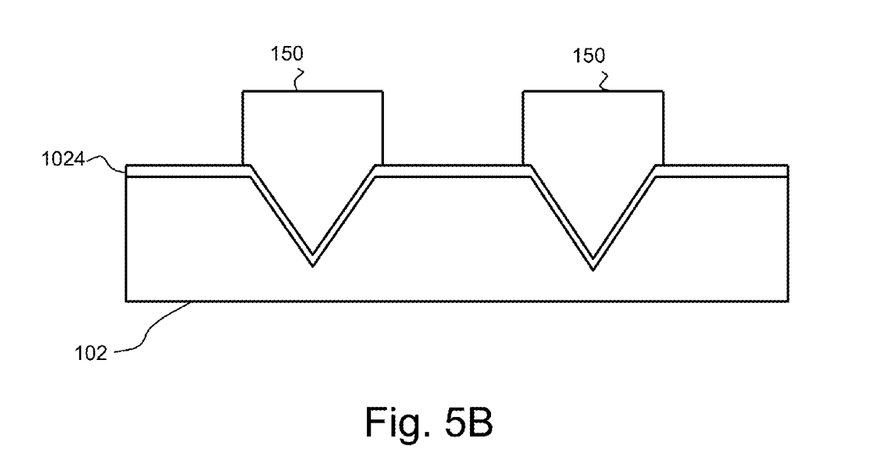

Removing 108 the patterned sacrificial layer 122 in typical wet strip, rinse, and dry, exposes the inverted connective bumps 150 in FIG. 5B. Again, even with low adhesion, adhesion is sufficient that the connective bumps do not wash away and hold in place when stripping the resist 122.

Figure 5C:
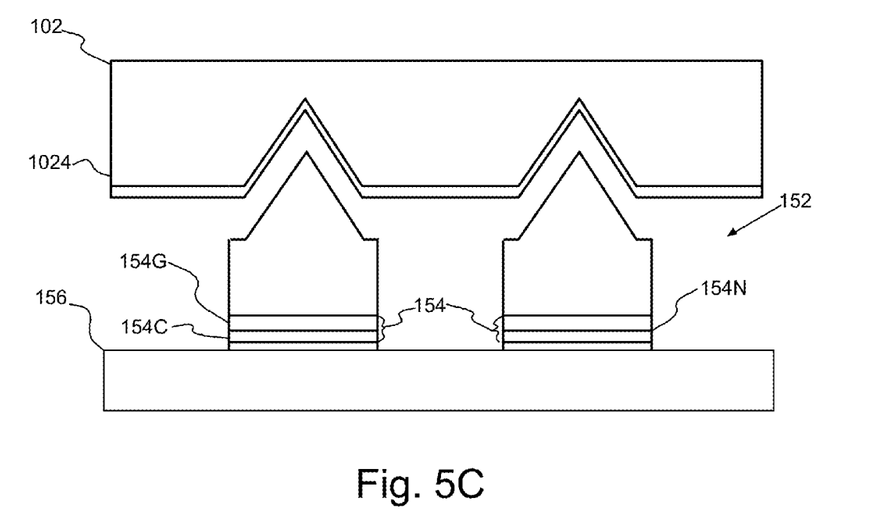

Next, the exposed connective bumps 150, still attached to the template wafer 102, are attached 110 to the article 152, e.g., reflow or thermo-compression bonded to IC pads 154 on patterned wafer 156 in FIG. 5C. In this example also, IC pads 154 are layered pads that include a base layer 154C, preferably copper, on the patterned wafer 156, interface layer 154N, preferably nickel, on base layer 154C, and anti-oxidation layer 154G, preferably gold, on the interface layer 154N. Once the connective bumps 150 are attached to the IC pads 154, the template wafer 102 is separated 112 from the wafer 156, using very little force to pry the template wafer 102 off. Finally, heating the wafer 156 reflows the connective bumps 158 to finish the BGA IC connects.

FIGS. 6A-D show an example of forming 100 an array of micro pillars on a tight array of high density IC chip I/O connects, formed as described in FIG. 1, and substantially similar to forming the probe tips and head of FIGS. 3A-D and micro-C4 BGA of FIG. 5A-D with like features labeled identically. Like the micro-C4 ball grid array, the micro pillar array is attached to the same IC chip pad array. Thus, the same or substantially similar, template wafer 102 used for forming both the probe array and the array of chip I/O connects may be used for forming the micro pillar array. After forming and patterning 104 the sacrificial layer 122 on the template wafer 102, a connective plug 160 of a suitable solder, e.g., Sn/Ag, is plated with a minimum thickness of 1-50 µm, preferably 10 µm. In this example, the connective plugs 160 are inverted connective bumps that partially fill each pit 1020. Pillar material 162, e.g., copper, is plated to the connective plugs 160. The pillar material 162 thickness selects the height of the completed pillars. An attach material layer 164, preferably a Sn/Ag solder, is plated to the pillar material 162.

Figure 6A:
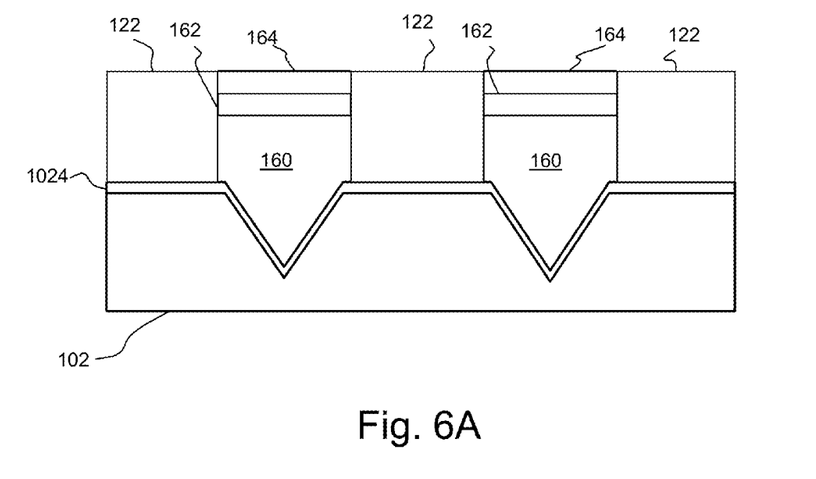
FIGS. 6A-D show an example of forming an array of micro pillars on a tight array of high density IC chip I/O connects.
Figure 6B:
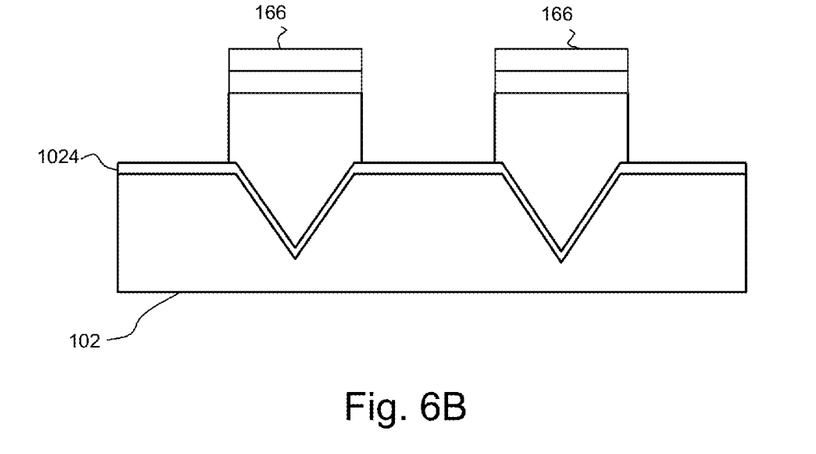

Removing 108 the patterned sacrificial layer 122 in typical wet strip, rinse, and dry, exposes the inverted micro pillars 166 in FIG. 6B. Again, even with low adhesion, adhesion is sufficient that the micro pillars 166 do not wash away until subsequently attached, and hold in place when stripping the resist 122.

Figure 6C:
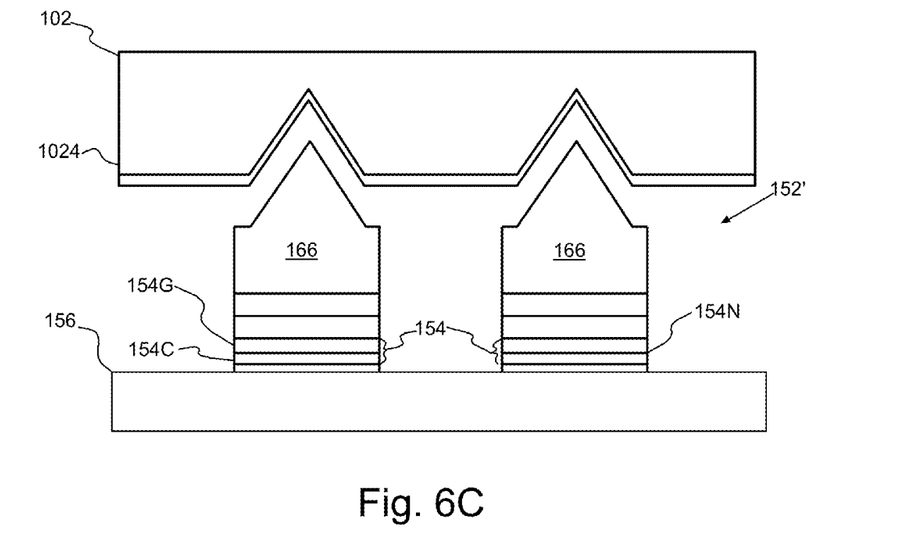
Figure 6D:
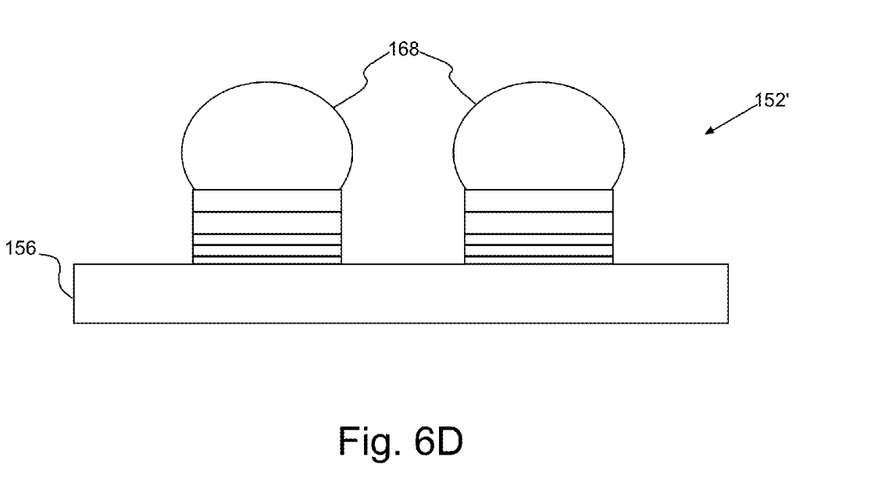

Next in FIG. 6C, the exposed micro pillars 166, still attached to the template wafer 102, are attached 110 to complete the article 152', e.g., reflow or thermo-compression bonded to IC pads 154 on patterned wafer 156. In this example also, IC pads 154 are layered pads that include a base layer 154C, preferably copper, on the patterned wafer 156, interface layer 154N, preferably nickel, on base layer 154C, and anti-oxidation layer 154G, preferably gold, on the interface layer 154N. Once the micro pillars 166 are attached to the IC pads 154, the template wafer 102 is separated 112 from the wafer 156, using very little force to pull or pry the template wafer 102 off. Finally, heating the article 152' reflows the pillar tops 168.

Although shown here for bumping the topside of a wafer/chip/module with an array of micro-C4s or micro pillars, it is understood that both sides may be bumped substantially identically, and simultaneously, to provide connects to both sides of a three-dimensional (3D) IC structure, i.e. a 3D chip or module.

FIGS. 7A-E show an example of forming 100 a micromachine(s) or micro-sensor(s) or other MEMS structure on an IC chip, formed as described in FIG. 1, and substantially similar to forming the probe tips and head of FIGS. 3A-D with like features labeled identically. Further, although a single MEMS structure is formed in this example, multiple such features may be formed simultaneously, separately or coincident with forming the connect array of FIG. 5A-D or 6A-D. Although shown and described in this example for forming a MEMS membrane structure, this is not intended as a limitation. The same structure or a similar structure may be used for any suitable use, e.g., as test probes for a MEMS probe head.

Figure 7A:
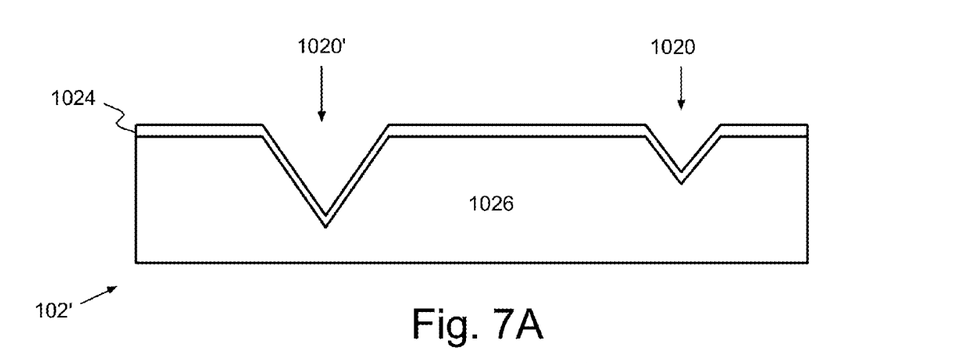
FIGS. 7A-E show an example of forming a micro-machine(s) or micro-sensor(s) or other MEMS structure on an IC chip.

Forming a MEMS structure requires a modified template wafer 102' in FIG. 7A, substantially similar to the template wafer 102 with like features labeled identically. The modified template wafer 102' includes one or more instances of pits 1020, 1020'. Without surface roughening pits the plated layer would tend to delaminate. So for example, a larger film requires more anchor surface, and therefore, has multiple instances of anchor pits 1020, spaced tens of microns from each other to facilitate plating stressed, thicker films to the low adhesion layer 1024. Thus, in this example, pits 1020 have substantially the same size as the probe tip pits in FIG. 2A, while the larger pits 1020' are 1-5 µm deep, preferably 3 µm deep, with a surface diagonal/diameter 2-10 µm, preferably 6 µm.

Figure 7B:
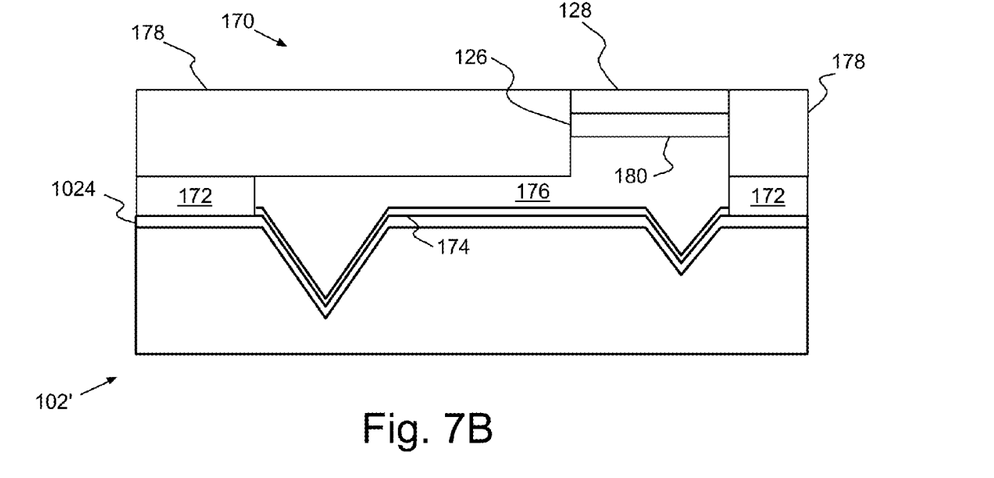

As shown in FIG. 7B forming the MEMS structure uses a double pattern 104 and electroplate 106, first forming the MEMS membrane and then, the MEMS structure attach. The membrane structure pattern 170 is formed in a first sacrificial layer 172. An optional hard capping material layer 174 is electroplated to the low adhesion seed layer 1024, substantially the same as hard caps 120. The hard cap 174, if included, covers the low adhesion seed layer 1024 in the MEMS structure location 170, lining both pits 1020, 1020'. Plating with conductive material, e.g., copper, forms a conductive membrane 176 on the hard cap 174, such that the plated conductive membrane 176 has a minimum thickness of 1-1000 µm, preferably 20 µm. A second sacrificial layer 178 is formed covering the first sacrificial layer 172 and of the copper membrane 176. The second sacrificial layer 178 is patterned to open attach locations above pits 1020'. Plating 106 with conductive material continues integrally forming a conductive plateau 180 that partially fills the open attach locations. Next, base layer 126 is electroplated to the conductive plateau 180, and attach material 128 is electroplated to the base layer 126.

Figure 7C:
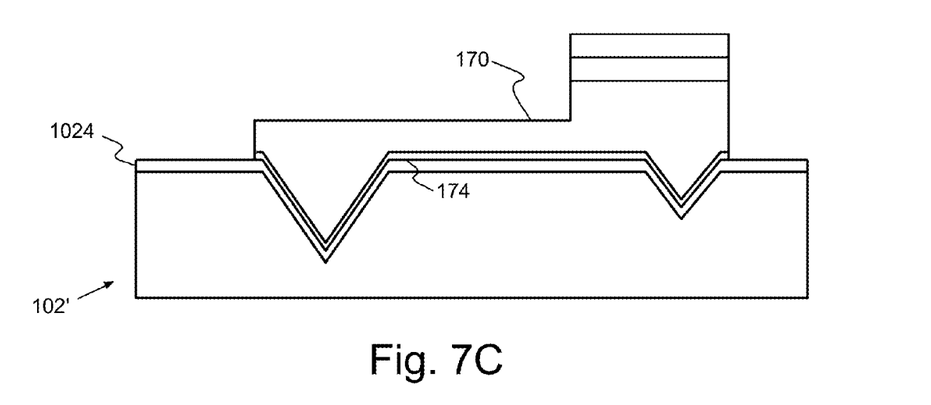

Removing 108 the patterned sacrificial layers 172, 178 in typical wet strip, rinse, and dry, exposes the inverted membrane structure 170 in FIG. 7C. Again adhesion is sufficient that the membrane 170 held in place when the resist is stripped.

Figure 5D:
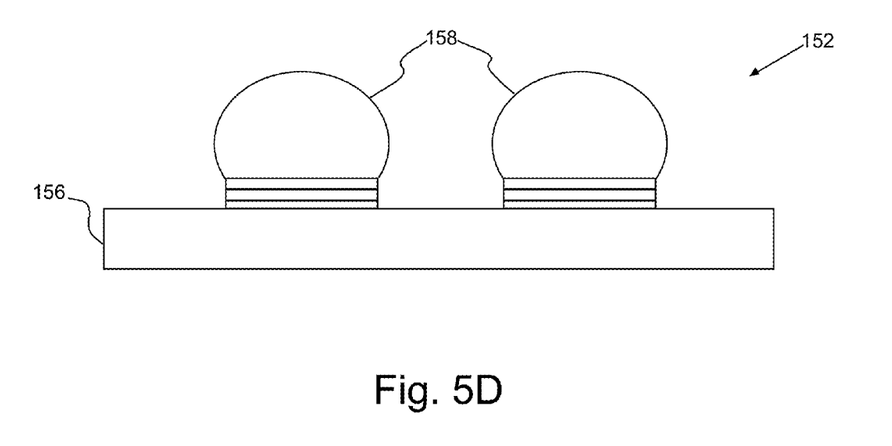
Figure 7D:
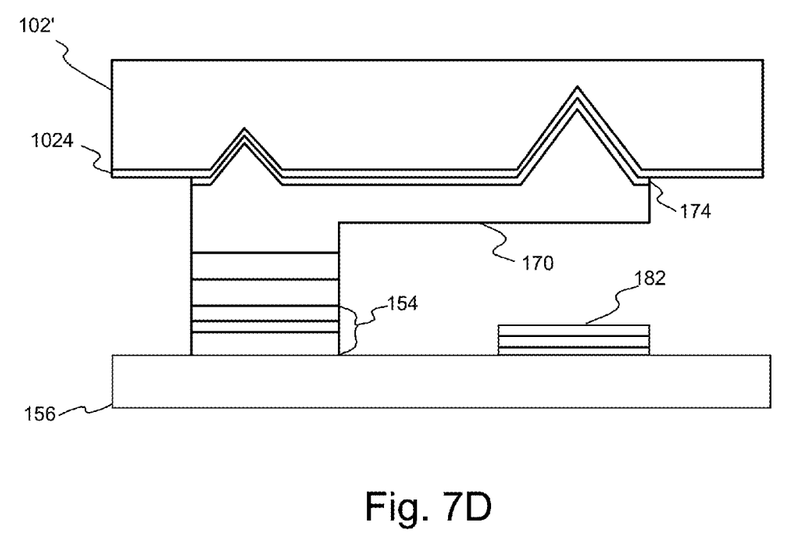

In FIG. 7D the exposed inverted membrane structure 170, still attached to the template wafer 102', is attached 110 to the article, e.g., reflow or thermo-compression bonded to a pad 154 and cantilevered above electrode 182, e.g., electrodes in a capacitive MEMS IC substrate, such as chip/wafer 156 in FIGS. 5C and D. Again, chip pads 154, 182 may be layered pads that include a base layer 154C on the chip/wafer 156, an interface layer 154N on base layer 154C and an anti-oxidation layer 154G on the interface layer 154N. Once the inverted membrane structure 170 is attached to the chip pad 154, the template wafer 102' is separated 112. Separating 112 the template wafer 102' from the completed MEMS device 184, uses very little force to pull or pry the template wafer 102 off without separation distorting or fracturing the membrane.

Figure 7E:
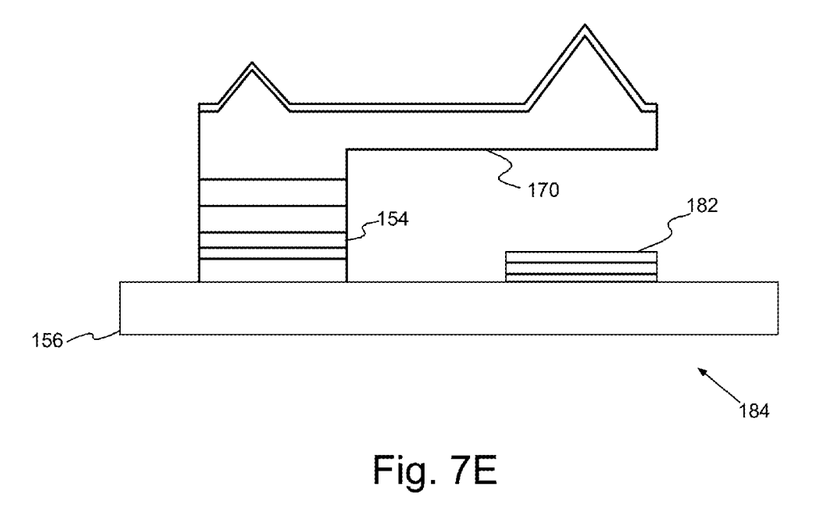

FIG. 7E shows the membrane structure 170 in place on the completed article 184, attached to the chip pad 154, with an outboard portion of the membrane cantilevered above the chip surface for interaction with other such structures, e.g., chip pad 182 for sensing changes in speed. Accordingly, the cantilevered membrane structure 184 is formed without micromachining to undercut the membrane, which previously was necessary to remove material from under metal lands to form micro-cantilevers. It should be noted that different pit 1020, 1020' sizes are shown for example only and depend on the specific application and needs to insure that the features adhere until intentionally transferred. Further, normal sized pits may form atomic force microscopy (AFM) tips, test probe tips or simply serve to anchor the structure during electroplating.

Figure 8:
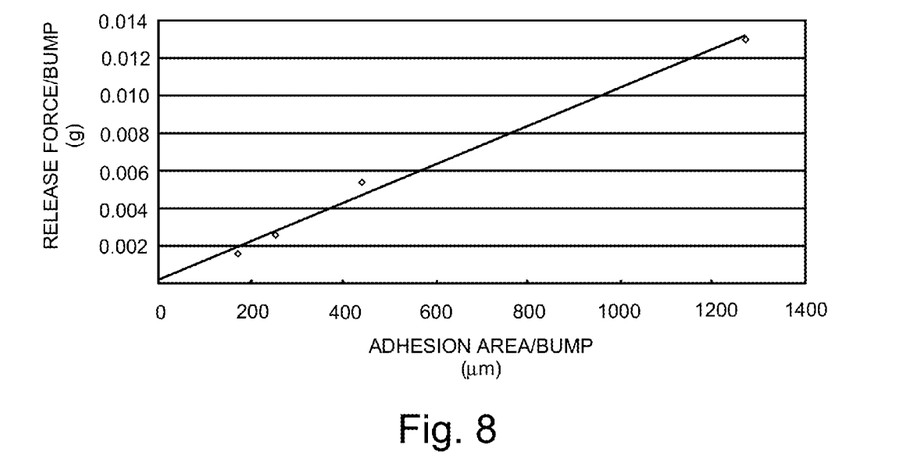
FIG. 8 shows a graphical comparison of protrusion release force against protrusion adhesion area.

FIG. 8 shows a graphical comparison of protrusion release force in grams (g) against protrusion adhesion area in square microns (µm$^2$). The present invention has been used to attach 48,000 protrusion 130 to an article (e.g., 140 in FIG. 4 substantially as described in FIGS. 1 and 3A-D), with only on the order of 100 grams of force required to cleanly separate 112 the template wafer 102 from the completed article 140. Thus, it is apparent that release force is directly related to, and monotonically increasing with, protrusion area.

Thus advantageously, preferred non-planar plating surfaces include cavities or roughness covered by low adhesion material that, in combination, overcome previously encountered low adhesion electroplating difficulties in nucleation and instability. The preferred pits improve and maintain sufficient adhesion on a low adhesion seed to prevent particle contamination from nucleates falling into the plating solution during electroplating. Further, the pits (i.e., the roughness) release/reduce film stress, improve plated multi-level stack structural integrity, and maintain stable, uniform current during plating. Thus, the present invention provides controlled electro-deposition on low adhesion film for forming micropillar and micro-C4 decals for IC bumping and for forming transferable fine-pitch probes at ultra-fine pitches. The present invention has further application to forming MEMS cantilevers and membranes in a way that does not require lengthy undercuts that previously were used to micro-machine such structures. Moreover, the present invention has application to forming other otherwise unprintable fine features.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming surface protrusions on an article, said method comprising:
   forming a sacrificial pattern layer on a surface layer of a template wafer;
   electroplating exposed areas of said surface layer;
   removing said sacrificial pattern layer, surface protrusions remaining protruding from said surface layer;
   attaching an article to said surface protrusions, said surface protrusions remaining sandwiched between said template wafer and said article; and
   separating said template wafer, said surface protrusions remaining attached to said article.

2. A method of forming surface protrusions on an article as in claim 1, said method further comprising forming said template wafer, forming said template wafer comprising:
   patterning said template wafer; and
   forming said surface layer on said patterned template.

3. A method of forming surface protrusions on an article as in claim 2, wherein patterning said template wafer comprises pitting a surface of said template wafer at protrusion locations.

4. A method of forming surface protrusions on an article as in claim 3, wherein pitting said surface comprises etching pyramidal shaped pits in said template wafer.

5. A method of forming surface protrusions on an article as in claim 3, wherein pitting said surface comprises etching an array of identical pits in said template wafer.

6. A method of forming surface protrusions on an article as in claim 3, wherein pitting said surface comprises etching pits having at least two different shape sizes in said template wafer.

7. A method of forming surface protrusions on an article as in claim 2, wherein forming said surface layer comprises oxidizing the surface of said surface layer.

8. A method of forming surface protrusions on an article as in claim 7, wherein forming said surface layer comprises:
   forming a base titanium (Ti) layer said template wafer;
   forming a copper (Cu) layer on said base Ti layer; and
   forming a Ti surface layer on said Cu layer, said oxidized surface being native oxide formed on said Ti surface layer.

9. A method of forming surface protrusions on an article as in claim 1, wherein electroplating comprises electroplating solder in said exposed areas.

10. A method of forming surface protrusions on an article as in claim 9, wherein said article includes surface pads at protrusion attach locations and attaching said article solders said pads to a respective protrusion.

11. A method of forming surface protrusions on an article as in claim 9, wherein electroplating comprises:
    electroplating a capping layer in said exposed areas;
    electroplating a conductive layer on said capping layer;
    electroplating a base layer to said conductive layer; and
    electroplating said solder to said base layer.

12. A method of forming surface protrusions on an article as in claim 11, wherein said article is a test probe head for testing integrated circuits (ICs) and attached said surface protrusions form a test probe array on said test probe head.

13. A method of forming surface protrusions on an article as in claim 9, wherein said article is an integrated circuit (IC), attached said surface protrusions are solder forming a bump array on said IC, and said method further comprises reflowing said attached surface protrusions.

14. A method of forming surface protrusions on an article as in claim 9, wherein said solder is a second solder layer and electroplating comprises:
    electroplating a first solder layer in said exposed areas;
    electroplating a pillar layer to said first solder layer; and
    electroplating said second solder layer to said pillar layer.

15. A method of forming surface protrusions on an article as in claim 14, wherein said article is an integrated circuit (IC), attached said surface protrusions are micro pillars in a bump array on said IC, and said method further comprises reflowing said first solder layer.

16. A method of forming surface protrusions on an article as in claim 9, wherein at least one attached protrusion is a cantilevered membrane, said a sacrificial pattern layer is a first sacrificial pattern layer, and electroplating comprises:
    electroplating a capping layer in said exposed areas;
    electroplating a conductive layer on said capping layer to a first thickness;
    forming a second sacrificial pattern layer partially covering electroplated said conductive layer;
    electroplating conductive material on exposed said conductive layer to a second thickness;
    electroplating a base layer to an upper conductive layer surface; and
    electroplating said solder to said base layer.

* * * * *